United States Patent [19]

Verboom

[11] Patent Number: 4,855,742

[45] Date of Patent: Aug. 8, 1989

[54] METHOD OF TRANSMITTING N-BIT INFORMATION WORDS, INFORMATION TRANSMISSION SYSTEM FOR CARRYING OUT THE METHOD, AND ENCODING DEVICE AND DECODING DEVICE FOR USE IN THE INFORMATION-TRANSMISSION SYSTEM

[75] Inventor: Johannes J. Verboom, Colorado Springs, Colo.

[73] Assignee: Optical Storage International Holland, Eindhoven, Netherlands

[21] Appl. No.: 119,463

[22] Filed: Nov. 9, 1987

[30] Foreign Application Priority Data

Dec. 12, 1986 [NL] Netherlands .................. 8603164

[51] Int. Cl.$^4$ ............................................. H03M 7/20
[52] U.S. Cl. .................................... 341/102; 341/103;
341/95; 341/67; 341/55; 360/40
[58] Field of Search ................ 340/347 DD; 360/40;
341/51, 52, 55, 67, 95, 102, 103

[56] References Cited

U.S. PATENT DOCUMENTS 4,348,659  9/1982  Fujimori ................... 340/347 DD

FOREIGN PATENT DOCUMENTS 2109200  5/1983  United Kingdom .

*Primary Examiner*—William M. Shoop, Jr.
*Assistant Examiner*—Gary Romano
*Attorney, Agent, or Firm*—Thomas A. Briody; Jack E. Haken; Jack D. Slobod

[57] ABSTRACT

An information-transmission system including an encoder for converting n-bit information words (D7, ..., D0) into transmitted m-bit code words (C10, ..., C0), and a decoder which reconverts the received code words (C'10, ..., C'0) into information words (D*7, ..., D*0) corresponding to the original information words. For a first group the encoder converts a first portion (D7, ..., D3) into a first portion of a code word, such portion comprising q bits (C10, ..., C5) thereof; and converts a second portion (D2, ..., D0) of the information word into a second portion of the code word, such portion comprising s bits (C4, ..., C0) thereof. For a second group the encoder converts a first portion (D7, ..., D3) into a second portion comprising q bits (C'5, ..., C'0) of a code word, and converts a second portion (D2, ..., D0) of the information word into a first portion comprising s-bits of (C'10, ..., C'6) such code word. The decoder reconverts a received code word by converting the first portion of such code word (C'10, ..., C'5) into the first portion (D*7, ..., D*3) of the information word to be reconverted therefrom; and converts the second portion of such code word (C'4, ..., C'0) into the second portion of such information word (D*2, ..., D*0). The decoder converts a received code word in the second group of information words by converting the first portion of such code word (C'5, ..., C'0) into the second portion (D*7, ..., D*3) of the information word to be reconverted, and converts the second portion of such code word (C'10, ..., C'6) into the first portion of such information word (D*2, ..., D*0).

7 Claims, 6 Drawing Sheets

| | D7 | D6 | D5 | D4 | D3 | S5 | S4 | S3 | S2 | S1 | S0 | R1 | R2 |
|---|---|---|---|---|---|---|---|---|---|---|---|---|---|
| | 0 | 0 | 0 | 0 | 0 | 0 | 0 | 0 | 0 | 0 | 1 | 0 | 0 |
| | 0 | 0 | 0 | 0 | 1 | 0 | 0 | 0 | 0 | 1 | 0 | 0 | 0 |
| | 0 | 0 | 0 | 1 | 0 | 0 | 0 | 0 | 1 | 0 | 0 | 0 | 0 |
| | 0 | 0 | 0 | 1 | 1 | 0 | 0 | 1 | 0 | 0 | 0 | 0 | 0 |
| | 0 | 0 | 1 | 0 | 0 | 0 | 1 | 0 | 0 | 0 | 0 | 0 | 0 |
| | 0 | 0 | 1 | 0 | 1 | 1 | 0 | 0 | 0 | 0 | 0 | 0 | 0 |
| | 0 | 0 | 1 | 1 | 0 | 0 | 0 | 0 | 0 | 1 | 1 | 0 | 1 |
| | 0 | 0 | 1 | 1 | 1 | 0 | 0 | 0 | 1 | 0 | 1 | 0 | 1 |
| | 0 | 1 | 0 | 0 | 0 | 0 | 0 | 0 | 1 | 1 | 0 | 0 | 1 |
| | 0 | 1 | 0 | 0 | 1 | 0 | 0 | 1 | 0 | 0 | 1 | 0 | 1 |
| t2 | 0 | 1 | 0 | 1 | 0 | 0 | 0 | 1 | 0 | 1 | 0 | 0 | 1 |
| | 0 | 1 | 0 | 1 | 1 | 0 | 0 | 1 | 1 | 0 | 0 | 0 | 1 |
| | 0 | 1 | 1 | 0 | 0 | 0 | 1 | 0 | 0 | 0 | 1 | 0 | 1 |
| | 0 | 1 | 1 | 0 | 1 | 0 | 1 | 0 | 0 | 1 | 0 | 0 | 1 |
| | 0 | 1 | 1 | 1 | 0 | 0 | 1 | 0 | 1 | 0 | 0 | 0 | 1 |
| | 0 | 1 | 1 | 1 | 1 | 0 | 1 | 1 | 0 | 0 | 0 | 0 | 1 |
| | 1 | 0 | 0 | 0 | 0 | 1 | 0 | 0 | 0 | 0 | 1 | 0 | 1 |
| | 1 | 0 | 0 | 0 | 1 | 1 | 0 | 0 | 0 | 1 | 0 | 0 | 1 |
| | 1 | 0 | 0 | 1 | 0 | 1 | 0 | 0 | 1 | 0 | 0 | 0 | 1 |
| | 1 | 0 | 0 | 1 | 1 | 1 | 0 | 1 | 0 | 0 | 0 | 0 | 1 |
| | 1 | 0 | 1 | 0 | 0 | 1 | 1 | 0 | 0 | 0 | 0 | 0 | 1 |
| | 1 | 0 | 1 | 0 | 1 | 1 | 0 | 0 | 0 | 0 | 1 | 1 | 1 |
| | 1 | 0 | 1 | 1 | 0 | 1 | 0 | 0 | 0 | 1 | 0 | 1 | 1 |
| | 1 | 0 | 1 | 1 | 1 | 1 | 0 | 0 | 1 | 0 | 0 | 1 | 1 |
| | 1 | 1 | 0 | 0 | 0 | 1 | 0 | 1 | 0 | 0 | 0 | 1 | 1 |
| | 1 | 1 | 0 | 0 | 1 | 1 | 1 | 0 | 0 | 0 | 0 | 1 | 1 |
| | 1 | 1 | 0 | 1 | 0 | 0 | 0 | 0 | 0 | 0 | 1 | 1 | 0 |
| | 1 | 1 | 0 | 1 | 1 | 0 | 0 | 0 | 0 | 1 | 0 | 1 | 0 |
| t1 | 1 | 1 | 1 | 0 | 0 | 0 | 0 | 0 | 1 | 0 | 0 | 1 | 0 |
| | 1 | 1 | 1 | 0 | 1 | 0 | 0 | 1 | 0 | 0 | 0 | 1 | 0 |
| | 1 | 1 | 1 | 1 | 0 | 0 | 1 | 0 | 0 | 0 | 0 | 1 | 0 |
| | 1 | 1 | 1 | 1 | 1 | 1 | 0 | 0 | 0 | 0 | 0 | 1 | 0 |

FIG. 3a

| $D_2$ | $D_1$ | $D_0$ | $R_2$ | $S'_4$ | $S'_3$ | $S'_2$ | $S'_1$ | $S'_0$ |
|---|---|---|---|---|---|---|---|---|
| 0 | 0 | 0 | 0 | 0 | 1 | 0 | 1 | 1 |
| 0 | 0 | 1 | 0 | 0 | 1 | 1 | 0 | 1 |
| 0 | 1 | 0 | 0 | 0 | 1 | 1 | 1 | 0 |
| 0 | 1 | 1 | 0 | 1 | 0 | 0 | 1 | 1 |
| 1 | 0 | 0 | 0 | 1 | 0 | 1 | 0 | 1 |
| 1 | 0 | 1 | 0 | 1 | 0 | 1 | 1 | 0 |
| 1 | 1 | 0 | 0 | 1 | 1 | 0 | 0 | 1 |
| 1 | 1 | 1 | 0 | 1 | 1 | 0 | 1 | 0 |
| --- | --- | --- | --- | --- | --- | --- | --- | --- |
| 0 | 0 | 0 | 1 | 0 | 0 | 1 | 0 | 1 |
| 0 | 0 | 1 | 1 | 0 | 0 | 1 | 1 | 0 |
| 0 | 1 | 0 | 1 | 0 | 1 | 0 | 0 | 1 |
| 0 | 1 | 1 | 1 | 0 | 1 | 0 | 1 | 0 |
| 1 | 0 | 0 | 1 | 0 | 1 | 1 | 0 | 0 |
| 1 | 0 | 1 | 1 | 1 | 0 | 0 | 0 | 1 |
| 1 | 1 | 0 | 1 | 1 | 0 | 0 | 1 | 0 |
| 1 | 1 | 1 | 1 | 1 | 0 | 1 | 0 | 0 |

| $C_5'$ | $C_4'$ | $C_3'$ | $C_2'$ | $C_1'$ | $C_0'$ | $D_7'$ | $D_6'$ | $D_5'$ | $D_4'$ | $D_3'$ |
|---|---|---|---|---|---|---|---|---|---|---|
| 1 | 0 | 0 | 0 | 0 | 1 | 1 | 0 | 1 | 0 | 1 |
| 1 | 0 | 0 | 0 | 1 | 0 | 1 | 0 | 1 | 1 | 0 |
| 1 | 0 | 0 | 1 | 0 | 0 | 1 | 0 | 1 | 1 | 1 |
| 1 | 0 | 1 | 0 | 0 | 0 | 1 | 1 | 0 | 0 | 0 |
| 1 | 1 | 0 | 0 | 0 | 0 | 1 | 1 | 0 | 0 | 1 |
| 0 | 0 | 0 | 0 | 0 | 1 | 1 | 1 | 0 | 1 | 0 |
| 0 | 0 | 0 | 0 | 1 | 0 | 1 | 1 | 0 | 1 | 1 |
| 0 | 0 | 0 | 1 | 0 | 0 | 1 | 1 | 1 | 0 | 0 |
| 0 | 0 | 1 | 0 | 0 | 0 | 1 | 1 | 1 | 0 | 1 |
| 0 | 1 | 0 | 0 | 0 | 0 | 1 | 1 | 1 | 1 | 0 |
| 1 | 0 | 0 | 0 | 0 | 0 | 1 | 1 | 1 | 1 | 1 |

FIG. 5a

| $C_{10}$ | $C_9$ | $C_8$ | $C_7$ | $C_6$ | $C_5$ | $D_7$ | $D_6$ | $D_5$ | $D_4$ | $D_3$ | $R_3$ |
|---|---|---|---|---|---|---|---|---|---|---|---|
| 0 | 0 | 0 | 0 | 0 | 1 | 0 | 0 | 0 | 0 | 0 | 1 |
| 0 | 0 | 0 | 0 | 1 | 0 | 0 | 0 | 0 | 0 | 1 | 1 |
| 0 | 0 | 0 | 1 | 0 | 0 | 0 | 0 | 0 | 1 | 0 | 1 |
| 0 | 0 | 1 | 0 | 0 | 0 | 0 | 0 | 0 | 1 | 1 | 1 |
| 0 | 1 | 0 | 0 | 0 | 0 | 0 | 0 | 1 | 0 | 0 | 1 |
| 1 | 0 | 0 | 0 | 0 | 0 | 0 | 0 | 1 | 0 | 1 | 1 |
| 0 | 0 | 0 | 0 | 1 | 1 | 0 | 0 | 1 | 1 | 0 | 1 |
| 0 | 0 | 0 | 1 | 0 | 1 | 0 | 0 | 1 | 1 | 1 | 1 |
| 0 | 0 | 0 | 1 | 1 | 0 | 0 | 1 | 0 | 0 | 0 | 1 |
| 0 | 0 | 1 | 0 | 0 | 1 | 0 | 1 | 0 | 0 | 1 | 1 |
| 0 | 0 | 1 | 0 | 1 | 0 | 0 | 1 | 0 | 1 | 0 | 1 |
| 0 | 0 | 1 | 1 | 0 | 0 | 0 | 1 | 0 | 1 | 1 | 1 |
| 0 | 1 | 0 | 0 | 0 | 1 | 0 | 1 | 1 | 0 | 0 | 1 |
| 0 | 1 | 0 | 0 | 1 | 0 | 0 | 1 | 1 | 0 | 1 | 1 |
| 0 | 1 | 0 | 1 | 0 | 0 | 0 | 1 | 1 | 1 | 0 | 1 |
| 0 | 1 | 1 | 0 | 0 | 0 | 0 | 1 | 1 | 1 | 1 | 1 |
| 1 | 0 | 0 | 0 | 0 | 1 | 1 | 0 | 0 | 0 | 0 | 1 |
| 1 | 0 | 0 | 0 | 1 | 0 | 1 | 0 | 0 | 0 | 1 | 1 |
| 1 | 0 | 0 | 1 | 0 | 0 | 1 | 0 | 0 | 1 | 0 | 1 |
| 1 | 0 | 1 | 0 | 0 | 0 | 1 | 0 | 0 | 1 | 1 | 1 |
| 1 | 1 | 0 | 0 | 0 | 0 | 1 | 0 | 1 | 0 | 0 | 1 |

FIG.5b

| $E_4$ | $E_3$ | $E_2$ | $E_1$ | $E_0$ | $D_2$ | $D_1$ | $D_0$ |
|---|---|---|---|---|---|---|---|
| 0 | 1 | 0 | 1 | 1 | 0 | 0 | 0 |
| 0 | 1 | 1 | 0 | 1 | 0 | 0 | 1 |
| 0 | 1 | 1 | 1 | 0 | 0 | 1 | 0 |
| 1 | 0 | 0 | 1 | 1 | 0 | 1 | 1 |
| 1 | 0 | 1 | 0 | 1 | 1 | 0 | 0 |
| 1 | 0 | 1 | 1 | 0 | 1 | 0 | 1 |
| 1 | 1 | 0 | 0 | 1 | 1 | 1 | 0 |
| 1 | 1 | 0 | 1 | 0 | 1 | 1 | 1 |
| 0 | 0 | 1 | 0 | 1 | 0 | 0 | 0 |
| 0 | 0 | 1 | 1 | 0 | 0 | 0 | 1 |
| 0 | 1 | 0 | 0 | 1 | 0 | 1 | 0 |
| 0 | 1 | 0 | 1 | 0 | 0 | 1 | 1 |
| 0 | 1 | 1 | 0 | 0 | 1 | 0 | 0 |
| 1 | 0 | 0 | 0 | 1 | 1 | 0 | 1 |
| 1 | 0 | 0 | 1 | 0 | 1 | 1 | 0 |
| 1 | 0 | 1 | 0 | 0 | 1 | 1 | 1 |

FIG.5c

METHOD OF TRANSMITTING N-BIT INFORMATION WORDS, INFORMATION TRANSMISSION SYSTEM FOR CARRYING OUT THE METHOD, AND ENCODING DEVICE AND DECODING DEVICE FOR USE IN THE INFORMATION-TRANSMISSION SYSTEM

BACKGROUND OF THE INVENTION

1. Field of the Invention

The invention relates to a method of transmitting n-bit information words, comprising an encoding step in which n-bit information words are converted into m-bit code words, m being greater than n, a transmission step for transmitting the m-bit code words, and a decoding step in which the transmitted m-bit code words are reconverted into n-bit information words.

The invention also relates to an information-transmission system for carrying out such a method, comprising an encoding device which is adapted to receive n-bit information words and to convert the received n-bit information words and into m-bit code words, a decoding device which is adapted to receive the m-bit code words and to reconvert the received code words into n-bit information words.

The invention further relates to an encoding and decoding device for use in the transmission system.

2. DESCRIPTION OF THE RELATED ART

A method, a transmission system, an encoding device and a decoding device as described in the opening paragraphs are known inter alia from European Patent Application EP No. 0,150,082 (PHN 11.117).

The above-mentioned method is often used to improve the quality of the information transmission. The use of code words having a larger number of bits than the information words ensures that the number of code words which may be used is larger than the number of different information words. For this purpose those code words are then selected which in conformity with a predetermined criterion are most suited for information transmission.

In the above-mentioned Application it is stated that n-bit information words can be converted into m-bit code words by means of a look-up table which stores an m-bit code word for every n-bit information word. In a similar way m-bit code words are converted into n-bit information words after transmission. A drawback of this is that the number of components required for the encoding device and decoding device is large. For example, when a memory is used to store the look-up table the number of storage locations required for this is equal to $2^n \times m$. When the codes are converted by means of gate circuits the number of gates required is also substantial.

SUMMARY OF THE INVENTION

It is an object of the invention to provide a method of the type defined in the opening paragraph which enables the information transmission to be carried out with less extensive circuitry. In accordance with the invention this object is achieved in that for each n-bit information word in a first group of n-bit information words to be transmitted, a predetermined first portion comprising p information bits is converted into a portion of an m-bit code word comprising a first predetermined group of q code bits, and a predetermined second portion comprising r information bits is converted into a portion of the code word comprising a second predetermined group of s code bits. For each n-bit information word of a second group of n-bit information words to be transmitted, a predetermined first portion is converted into a portion of an m-bit code word comprising a second predetermined group of q code bits, and a predetermined second portion is converted into a portion of the m-bit code word comprising a first predetermined group of s code bits.

Since in accordance with the invention the n-bit information word is split into two separate portions which are each separately converted into a different portion of the m-bit code word, only two comparatively simple code converters are required for encoding. Moreover, since the bit positions on which the first and the second portion of the n-bit information word are imaged are different for the first and the second groups of information words, the number of m-bit code words which can be formed by means of these two comparatively simple code converters can be extended substantially, so that the first and the second group of n-bit information words can be converted by means of circuitry comprising a comparatively small number of components.

An embodiment of the method is characterized in that p is greater than r and in that q is greater than s, the first group of n-bit information words comprising at least a first and a second sub-group of n-bit information words and the second group of n-bit information words comprising at least a third and a fourth sub-group of n-bit information words. The conversion of n-bit information words of the first and the second groups is effected by converting the first portion of the n-bit information words into a q-bit sub-code word in accordance with a first conversion rule, the conversion of n-bit information words of the first and third sub-group being effected by converting the second portion of the n-bit information words into s-bit sub-code words in accordance with a second conversion rule, the conversion of n-bit information words of the second and the fourth sub-group of n-bit information words being effected by converting the second portion of the n-bit information words into s-bit sub-code words in accordance with a third conversion rule. The conversion of n-bit information words of the first and the second group is effected by combining the q-bit sub-code words and the s-bit sub-code words in a first manner and a second manner respectively. The conversion of the transmitted m-bit code words into n-bit information words is also effected by means of two simple code converters which convert a portion of the m-bit code word into a portion of the n-bit information word.

A transmission system for carrying out the method in accordance with the invention is characterized in that the encoding device comprises means which derive from the received code word a first control signal which indicates to which of the first or the second group of n-bit information words the received code word belongs, means for converting the first portion of the information word into a first q-bit sub-code word, means for converting the second portion of the information word into an s-bit sub-code word, and means for combining the code bits of the q-bit and s-bit subcode words into an m-bit code word depending on the first control signal in such a way that for a first logic level of such control signal the code bits of the q-bit sub-code word respectively and the s-bit code word correspond to code bits of a m-bit code word to be formed at the first group of q code-bit positions and the first group of s code-bit positions, and in that for a second logic level of such control signal the code bits of the q-bit and s-bit sub-code words respectively correspond to code bits of the m-bit code word to be formed at a second group of q code-bit positions and a second group of s-code-bit positions of a second group of n-bit code words. The number of components required for the encoding device is very small when this transmission system is used.

An embodiment of the transmission system is characterized in that the decoding device comprises means for deriving a second logic control signal from each received m-bit code word, the logic value of said control signal indicating to which of the first or the second group of m-bit code words the received m-bit code word belongs, means for converting, depending on the logic value of the second control signal, the code bits at the first group of code-bit positions or the code bits at the second group of q code bit positions into a p-bit sub-information word representing the first portion of the n-bit information word, means for converting, depending on the logic level of the second control signal, the code bits at the first group of s code-bit positions or the code bits at the second group of s code-bit positions into an r-bit sub-information word which represents the second portion of the n-bit information word to be reconverted. This transmission system has the advantage that the number of components required for the decoding device is small.

BRIEF DESCRIPTION OF THE DRAWINGS

Embodiments of the invention and further advantages thereof will now be described in more detail, by way of example, with reference to the accompanying FIGS. 1 to 5, of which

DESCRIPTION OF THE PREFERRED EMBODIMENTS

Figure 1:
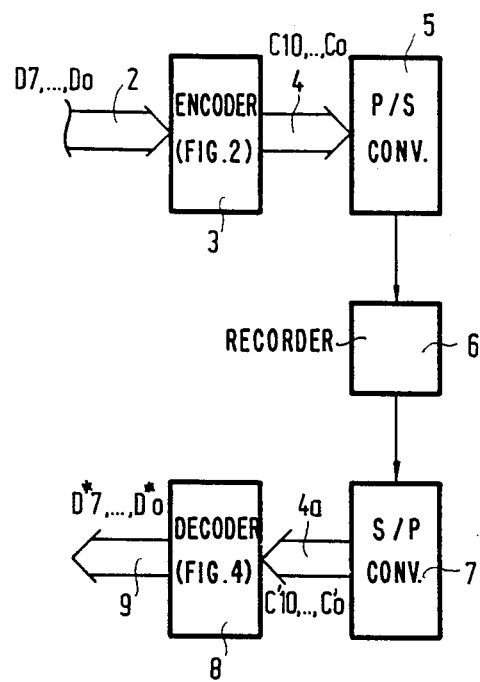
FIG. 1 shows an information-transmission system for transmitting n-bit information words.

FIG. 1 shows a transmission system 1 for transmitting 8-bit information words. The transmission system 1 comprises a 8-bit input bus 2 for the parallel reception of 8-bit information words. The input bus 2 is connected to the parallel inputs of an encoding circuit 3 which generates an 11-bit code word for every information word in accordance with conversion rules defined in the encoding circuit 3. The generated code words are transmitted to a parallel-to-series converter 5 via an 11-bit bus 4. The parallel-to-series converter 5 converts the code words into a serial data sequence, which is for example recorded on an optically readable record carrier by means of an optical recorder 6. This process is synchronised in a customary manner by means of clock signals. The synchronisation will not be described because falls beyond the scope of the present invention. In principle, decoding is possible by means of a similar circuit in which the process is carried out in the reverse sequence. The signal which is read from the optically readable record carrier by means of the optical recorder 6 is arranged in 11-bit code words by means of a series-to-parallel converter 7. These code words are applied to a decoding circuit 8, via a bus 4a which circuit reconverts these code words into 8-bit information words by means of a decoding circuit 8 in conformity with conversion rules which are complementary to the conversion rules for encoding. The information words thus obtained are available via an output bus 9. This process is again synchronised by means of clock signals which are derived from the signal from the recorder 6. Again this synchronisation is not described because it falls beyond the scope of the present invention.

Figure 2:
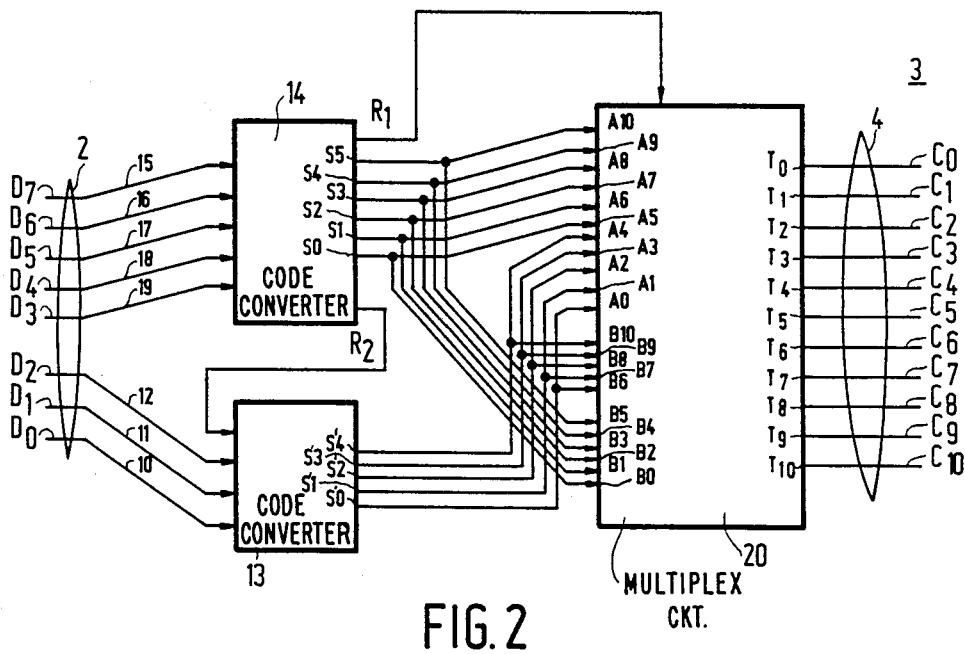
FIG. 2 shows an embodiment of an encoding circuit in accordance with the invention for use in the information-transmission system shown in FIG. 1, FIGS. 3a and 3b illustrate the relationships between the input and output signals of the code converters used in the encoding circuit.

FIG. 2 by way of example shows an embodiment of the encoding circuit 3 in accordance with the invention for converting 8-bit information words into 11 bit code words each having four bits of a logic value "1". The encoding circuit 3 comprises a first code converter 14 to which signals $D7, \ldots, D3$ are applied via signal lines 15, ..., 19 of the bus 2, which signals represent the five most significant bits of the received information words. The code converter 14 converts the signals $D7, \ldots D3$ into six signals $S5, \ldots, S0$ in accordance with a conversion rule defined in the code converter. Such a first code converter 14 may comprise, for example, a read-only memory (ROM) in which the conversion rule is stored in the form of a look-up table. Alternatively, such a code converter may comprise a gate circuit. The relationship f1 between the signals $D7, \ldots, D3$ and the signals $S5, \ldots, S0$ is shown in the Table of FIG. 3a. The group of used combinations of the signals $S5, \ldots, S0$ comprises all possible combinations with one logic "1" or two logic "1"s. The number of used combinations $S5, \ldots, S0$ is smaller than the number of possible combinations of the signals $D7, \ldots, D3$, so that certain combinations of $S5, \ldots, S0$ correspond to two different combinations of $D7, \ldots, D3$. In order to distinguish between the separate combinations of such a pair of combinations the code converter generates a control signal R1. The code converter 14 further generates a control signal R2 which indicates whether the combination of $S5, \ldots, S0$ contains one logic "1" or two logic "1"s.

The signals D2, D1 and D0, which represent the 3 least-significant bits of the information word applied via the bus 2, are fed to a second code converter 13 via signal lines 12, 11 and 10. The code converter 14 converts the signals D2, D1 and D0 into five signals $S'4, \ldots, S'0$. In addition to the signals D2, D1, and D0 the control signal R2 is applied to the code converter 13. Depending on the logic value of the control signal R2 the signals D2, D1 and D0 are converted in accordance with a second conversion rule or a third conversion rule. The relationship between the signals $S'4, \ldots, S'0$ and between the signals D2, D1, D0 and R2 is given in a Table in FIG. 3b. This relationship is selected in such a way that if the logic value of control signal R2 is "0" the converter 13 generates a combination of $S'4, \ldots, S'0$ with three logic values which are "1" and that if the logic value of the control signal R2 is "1" the code converter generates a combination of $S'4, \ldots, S'0$ with two logic values equal to "1". The output signals $S'4, \ldots, S'0$ of the code converter 13 are applied to the inputs $A4, \ldots, A0$ respectively of a first channel A of a two-channel multiplex circuit 20. The output signals $S'4, \ldots, S'0$ of the code converter 13 are further applied to the respective inputs B10, ..., B6 of the second channel B of the multiplex circuit 20. The output signals S5, ..., S0 of the code converter 14 are applied both to the inputs A10, ..., A5 of channel A of the multiplex circuit 20 and to the inputs B5, ..., B0 of channel B of the multiplex circuit 20. The control signal R1 functions as a control signal for the multiplex circuit 20. The multiplex circuit 20 is of a type which connects the outputs T10, ... T0 to inputs A10, ..., A0 if the control signal R1 is "0" and which connects these outputs to the inputs B10, ..., B0 if the control signal R1 is "1".

The signals C10, ..., C0 on the outputs T10, ..., T0 of the multiplex circuit represent the 11-bit code words generated by the encoding circuit 3. Thus, if via the input bus 2 an 8-bit information word is applied which belongs to the group for which a control signal R1 which is "0" is generated, the 6 signals C10, ..., C5 representing the 6 most significant bits of the generated 11-bit code word are determined by the signals D7, ..., D3 which represent the five most significant bits of the applied information word. In that case the signals C4, ..., C0 which represent the five least significant bits of the generated 11-bit code word are determined by the signals D2, ..., D0 which represent the three least significant bits of the information word. The conversion rule used for converting the signals D2, ..., D0 into the signals C4, ..., C0 depends on the logic value of the control signal R2. If as described above the applied information word belongs to the group for which a control signal R1 which is "1" is generated, the three least significant bits of the applied 8-bit information words determine the five most significant bits of the generated code word. The five significant bits of the applied information word then determine the six least significant bits of the generated code word.

In the manner described in the foregoing it is thus achieved that by means of an encoding circuit comprising a very small number of components, an 8-bit information word can be converted into an 11-bit code word comprising 4 bits of the logic value "1". For example, if the code converters 13 and 14 only comprise read-only memories the number of storage locations required for the code converter 14 is equal to $2^5 \times 8 = 256$ and that for the code converter 13 is equal to $2^4 \times 5 = 80$. Compared with the encoding circuit in which the actual encoding circuit comprises one look-up table for all the 8-bit information words, which table consequently comprises $2^8 \times 11 = 2816$ storage locations, a substantial number of components are saved. It is evident that if the code converters 13 and 14 and the multiplex circuit comprise gate circuits, the saving on components is also substantial.

Figures 3B, 4:
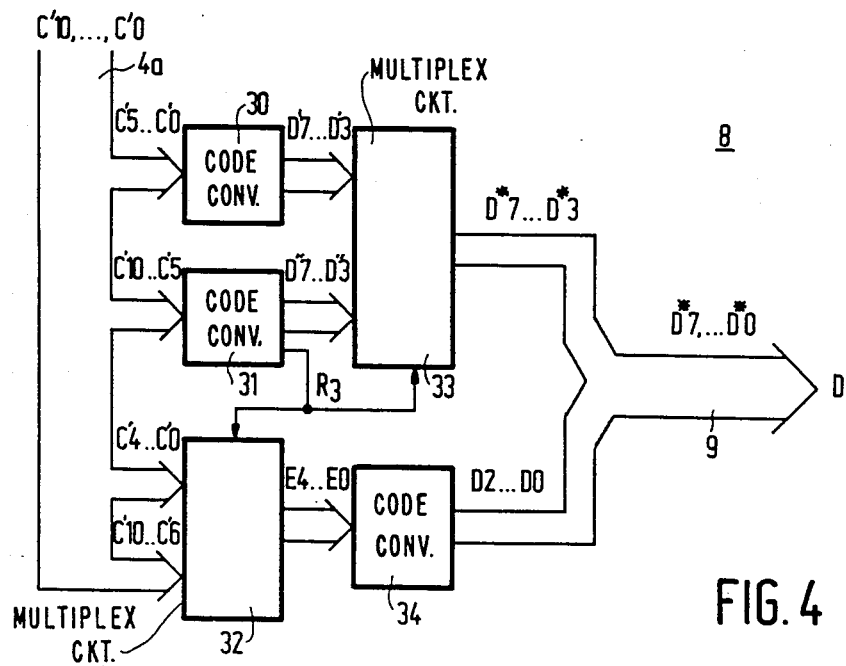
FIG. 4 shows an embodiment of a decoding circuit in accordance with the invention for use in the information transmission system shown in FIG. 1, FIGS. 5a, 5b and 5c show the relationships between the input and output signals of the code converters used in the decoding circuit.

FIG. 4 by way of example shows a decoding circuit in accordance with the invention by means of which 11-bit code words can be reconverted into 8-bit information words. The signals C'10, ..., C'0 represent the 11-bit code words received by the decoding circuit 8 via the bus 4a, said code words being obtained by means of the encoding method described in the foregoing.

The signals C'5, ..., C'0 representing the six least significant bits of the received code word are applied to the inputs of a code converter 30. The signals C'10, ..., C'5 representing the six most significant bits of the received code word are applied to a code converter 31. The signals C'4, ..., C'0 representing the five least significant bits of the received code word are applied to the inputs of a first channel of a two-channel multiplex circuit 32, whilst the signals C'10, ..., C'6 representing the five least significant bits of the received code word are applied to the inputs of the second channel of the two-channel multiplex circuit 32. The code converter 30 converts the signals C'5, ..., C'0 into five signals D''7, ..., D''3 in accordance with a conversion rule which is complementary to the conversion rule given in the sub-table t1 in FIG. 3a. The relationship between the signals C'5, ..., C'0 and the signals D''7, ..., D''3 is given in the table in FIG. 5a.

The code converter 31 converts the signals C'10, ..., C'5 into five signals D'''7, ..., D'''3 in accordance with a conversion rule which is complementary to the conversion rule given in the subtable t2 in FIG. 3a. The relationship between the signals C'10, ..., C'5 and the signals D'''7, ..., D'''3 is given in the table of FIG. 5b.

In addition to the signals D'''7, ..., D'''3 the code converter 31 generates a control signal R3. The control signal R3 has a logic value "1" for each combination of the signals C'10, ..., C'5 given in FIG. 5b, whilst for each combination of these signals not given in FIG. 5b the control signal has the logic value "0".

The output signals D'''7, ..., D'''3 of the code converter 31 are applied to the inputs of a first channel of a two-channel multiplex circuit 33, whilst the output signals D''7, ..., D''3 of the code converter 30 are applied to the inputs of the second channel of the multiplex circuit 33. The multiplex circuit 33 is controlled by the control signal R3 in such a way that if the logic value of the control signal is "1" the output signals D7, ..., D3 of the multiplex circuit 33 correspond to the signals D'''7, ..., D'''3 on the inputs of the second channel and if the logic value of the control signal R3 is "0" the output signals D7, ..., D3 correspond to the signals D''7, ..., D''3 on the inputs of the first channel. The output signals D7, ..., D3 represent the five most significant bits of the reconverted 8-bit information word which is applied via the output bus 9.

The multiplex circuit 32 is also controlled by the control signal R3 in such a way that if the logic value of the control signal R3 is "1", the output signals E4, ..., E0 of the multiplex circuit 32 correspond to the signals C'4, ..., C'0 and if this logic value is "0" the output signals E4, ..., E0 correspond to the signals C'10, ..., C'6. The output signals E4, ..., E0 are applied to a code converter 34, which converts the signals E4, ..., E0 into three output signals D2, ..., D0 in conformity with a conversion rule which is complementary to the conversion rule given in the table of FIG. 3b. The relationship between the signals E4, ..., E0 is given in the form of a table in FIG. 5c. The output signals D2, ..., D0 represent the 3 least significant bits of the reconverted 8-bit information word which is applied via the bus 9.

Thus, if in the decoding circuit 8 described in the foregoing the received code word belongs to the group for which a control signal R3 of the logic value "1" is generated the 5 most significant bits of the reconverted information word are determined by the six most significant bits of the received code word. The 3 least significant bits of the reconverted information words are determined by the five least significant bits of the received code word.

However, if the received code word belongs to a group for which a control signal R3 having a logic value "0" is generated, the five most significant bits of the reconverted information word are determined by the six least significant bits of the received code and the three least significant bits of the reconverted information word are determined by the five most significant bits of the received code words. It will be evident that the number of components required for the decoding circuit is also very small.

What is claimed is:

1. A method of transmitting n-bit information words, such method comprising encoding each information word to be transmitted by converting it into an m-bit code word, m being greater than n; transmission of the m-bit code word, and decoding the received m-bit code word by reconverting it into an n-bit information word; characterized in that for a first group of the information words to be transmitted, a predetermined first portion comprising p-bits of each such information word is converted into a predetermined first group of q bits of an m-bit code word, and a predetermined second portion comprising r-bits of such information word is converted into a predetermined second group of s-bits of such code word; and for a second group of the information words to be transmitted, a predetermined first portion comprising p-bits of each such information word is converted into a predetermined second group of q-bits of an m-bit code word, and a predetermined second portion comprising r-bits of such information word is converted into a predetermined first group of s-bits of such code word; whereby the groups of q-bits and s-bits in each code word are combined in accordance with whether the information word represented by such code word is in said first or said second group of information words.

2. A method as claimed in claim 1, characterized in that for received code words which represent information words in said first group of information words a first group of q-bits of each such code word is converted into the first portion of the information word represented by such code word, and a second group of s-bits of such code word is converted into the second portion of such information word; and for received code words which represent information words in said second group of information words a second group of q-bits of each such code word is converted into the first portion of the information word represented by such code word, and a first group of s-bits of such code word is converted into the second portion of such information word.

3. A method as claimed in claim 1, characterized in that p is greater than r; q is greater than s; said first group of information words comprises at least a first and second sub-groups and said second group of information words comprises at least third and fourth sub-groups; the first p-bit portion of each information word in either of the first and second groups of information words is converted into a q-bit sub-code word in accordance with a first conversion rule; the second r-bit portion of each information word either of in the first and third sub-groups is converted into an s-bit sub-code word in accordance with a second conversion rule; the second r-bit portion of each information word in either of the second and fourth sub-groups is converted into an s-bit sub-code in accordance with a third conversion rule; code words representing information words in said first group of information words are formed by combining the q-bit and s-bit sub-code words derived from such information words in a first relative order; and code words representing information words in said second group of information words are formed by combining the q-bit and s-bit sub-code words derived from such information words in a second relative order.

4. A method as claimed in claim 3, wherein each code word includes a predetermined number of bits having a first logic value; the conversion of an information word in either of said first and third sub-groups is effected by converting the first p-portion of such information word into a q-bit sub-code word having one code bit of said first logic value and converting the second r-bit portion of such information word into an s-bit sub-code word having three code bits of said first logic value; and the conversion of an information word in either of said second and fourth sub-groups is effected by converting the first p-bit portion and the second s-bit portion of such information word respectively into a q-bit sub-code word and a s-bit sub-code word, each of such sub-code words having two code bits of said first logic value.

5. An encoder for an information-transmission system in which n-bit information words are transmitted in the form of m-bit code words, such encoder receiving each such information word and converting to into a corresponding code word, such encoder comprising:

a first code converter for converting a first p-bit portion of a received information word into a first q-bit sub-code word and producing a first control signal signifying whether such information word belongs to a first or a second group of information words;

a second code converter for converting a second r-bit portion of the received information word into an s-bit sub-code word; and means coupled to said first and second code converters and controlled by said first control signal for combining the q-bit and s-bit sub-code words into an m-bit code word;

a first logic value of said first control signal causing the q-bit and s-bit code words to be combined so they respectively constitute a first group of q-bit positions and a first group of s-bit positions of the combined code word formed therefrom, and a second logic value of said first control signal causing the q-bit and s-bit sub-code words to be combined so they respectively constitute a second group of q-bit positions and a second group of s-bit positions of the combined code word formed therefrom.

6. A decoder for an information-transmission system in which n-bit information words are transmitted in the form of m-bit code-words, such decoder receiving each such code word and reconverting to into a corresponding information word, such decoder comprising:

a first code converter producing from each received code word a control signal having a logic value signifying whether such code word belongs to a first or a second group of code words;

a second code converter controlled by said control signal for converting, depending on the logic value of such signal, the bits in either a first group of q-bit positions of the received code word or in a second group of q-bit positions of such code word into a p-bit sub-information word representing a first portion of an n-bit information word corresponding to the received code word;

a third code converter controlled by said control signal for converting, depending on the logic value of such signal, the bits in either a first group of s-bit positions of the received code word or in a second group of s-bit positions of such code word into an r-bit sub-information word representing a second portion of the n-bit information word corresponding to the received code word; and means for combining said p-bit and s-bit sub-information words to reconstitute the information word corresponding to the received code word.

7. An encoder as claimed in claim 5, further characterized in that said first code converter also produces a second control signal having a logic value signifying whether a received information word belongs to either of a first and a third sub-group of information words or to either of a second and a fourth sub-group of information words; and said second code converter is controlled by said second control signal to convert the r-bit portion of the received information word to the s-bit portion of a code word corresponding thereto in accordance with either a first or a second conversion relationship, depending on the logic value of said second control signal.

* * * * *